United States Patent
Huang et al.

(10) Patent No.: US 7,859,234 B2
(45) Date of Patent: Dec. 28, 2010

(54) SWITCH CIRCUIT TO CONTROL ON/OFF OF A HIGH VOLTAGE SOURCE

(75) Inventors: Chih-Feng Huang, Jhubei (TW); Ta-Yung Yang, Milpitas, CA (US)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 11/399,338

(22) Filed: Apr. 7, 2006

(65) Prior Publication Data
US 2007/0236274 A1    Oct. 11, 2007

(51) Int. Cl.
*G05F 1/40* (2006.01)
(52) U.S. Cl. .................. 323/273; 323/274; 323/284; 323/353
(58) Field of Classification Search ............ 363/49; 323/273, 274, 284, 290, 351, 352, 353
See application file for complete search history.

(56) References Cited

U.S. PATENT DOCUMENTS

| | | | |
|---|---|---|---|
| 4,060,846 A * | 11/1977 | Conn | 361/193 |
| 4,931,656 A * | 6/1990 | Ehalt et al. | 327/514 |
| 5,656,956 A * | 8/1997 | Ohta et al. | 326/120 |
| 6,125,046 A * | 9/2000 | Jang et al. | 363/49 |
| 6,181,541 B1 * | 1/2001 | Souri et al. | 361/106 |
| 6,259,618 B1 * | 7/2001 | Liaw et al. | 363/147 |
| 6,614,281 B1 * | 9/2003 | Baudelot et al. | 327/321 |
| 6,865,093 B2 * | 3/2005 | Disney | 363/21.1 |
| 7,082,020 B2 * | 7/2006 | Friedrichs et al. | 361/93.9 |
| 2007/0236970 A1 * | 10/2007 | Yang et al. | 363/49 |
| 2007/0247225 A1 * | 10/2007 | Huang et al. | 330/111 |

* cited by examiner

*Primary Examiner*—Jessica Han
(74) *Attorney, Agent, or Firm*—Rosenberg, Klein & Lee

(57) ABSTRACT

A switch circuit to control a high voltage source is presented. It includes a JFET transistor, a resistive device, a first transistor and a second transistor. The JFET transistor is coupled to the high voltage source. The first transistor is connected in serial with the JFET transistor to output a voltage in response to the high voltage source. The second transistor is coupled to control the first transistor and the JFET transistor in response to a control signal. The resistive device is coupled to the JFET transistor and the first transistor to provide a bias voltage to turn on the JFET transistor and the first transistor when the second transistor is turned off. Once the second transistor is turned on, the first transistor is turned off and the JFET transistor is negative biased.

18 Claims, 3 Drawing Sheets

SWITCH CIRCUIT TO CONTROL ON/OFF OF A HIGH VOLTAGE SOURCE

BACKGROUND OF THE INVENTION

1. Field of the Invention

The present invention relates to a switch circuit. More particularly, the present invention relates to a switch circuit to control on/off of a high voltage source.

2. Description of Related Art

FIG. 1 shows a circuit diagram of a traditional switch circuit to control on/off of a high voltage source, in which a voltage $V_D$ is required to provide a supply voltage to a load 10. The voltage $V_D$ is supplied from a high voltage source $V_{IN}$ through a transistor 11. A drain terminal and a source terminal of the transistor 11 are coupled to the high voltage source $V_{IN}$ and the load 10 respectively. A resistor 15 is coupled from the drain terminal of the transistor 11 to a gate terminal of the transistor 11. The resistor 15 is used to provide a bias voltage to turn on the transistor 11. A drain terminal and a source terminal of a transistor 12 are coupled to the gate terminal of the transistor 11 and a ground respectively. A gate terminal of the transistor 12 is coupled to an output terminal of an inverter 14. An input terminal of the inverter 14 receives a control signal $S_N$. The transistor 12 is controlled by the control signal $S_N$ through the inverter 14. Therefore, the transistor 12 can be turned on to switch off the transistor 11 in response to the disabling state of the control signal $S_N$. However, when the transistor 12 is turned on, the resistor 15 will consume a power $P_R$, it is given by, $$P_R = \frac{V_{IN}^2}{R_{15}} \quad (1)$$

wherein $R_{15}$ is a resistance of the resistor 15.

The high voltage source $V_{IN}$ would be as high as $350V_{DC}$ when a high line voltage is connected. Therefore, a significant power loss will be produced at the resistor 15. The resistor 15 in high resistance such as several mega ohms can be used to reduce the power loss. However such the resistor 15 in high resistance is not appropriate to be built into an integrated circuit. Therefore, it is desirable to develop a high efficiency switch circuit to switch on/off of the high voltage source, specifically to develop an integrated circuit to switch on/off of the high voltage source.

SUMMARY OF THE INVENTION

The present invention provides a switch circuit to control on/off of a high voltage source. It includes a JFET transistor, a resistive device, a first transistor and a second transistor. The JFET transistor is coupled to input the high voltage source. The first transistor is connected in serial with the JFET transistor to output a voltage in response to the high voltage source. The second transistor is coupled to control the first transistor and the JFET transistor in response to a control signal. The resistive device is coupled to the JFET transistor and the first transistor to provide a bias voltage to turn on the JFET transistor and the first transistor when the second transistor is turned off. Once the second transistor is turned on, the first transistor is turned off and the JFET transistor is negative biased.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings.

DETAILED DESCRIPTION OF THE INVENTION

Figure 1:
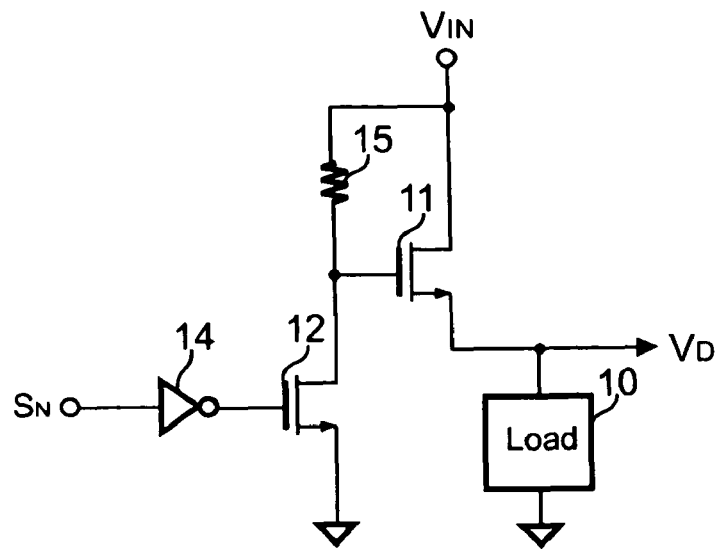
FIG. 1 shows a circuit diagram of a traditional switch circuit to control on/off of a high voltage source.
Figure 2:
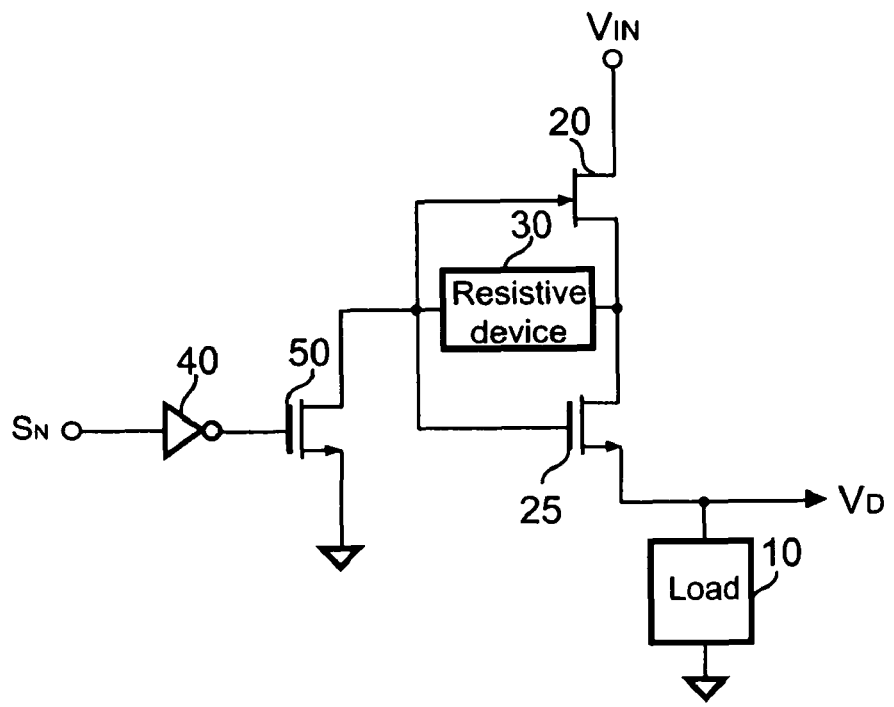
FIG. 2 shows a circuit diagram of a switch circuit to control on/off of a high voltage source according to the present invention.

FIG. 2 shows a preferred embodiment of a switch circuit according to the present invention. It comprises a JFET transistor 20, a resistive device 30, a first transistor 25 and a second transistor 50. The JFET transistor 20 has a first terminal, a second terminal and a third terminal. The first terminal of the JFET transistor 20 is supplied from a high voltage source $V_{IN}$. The first transistor 25 is connected in serial with the JFET transistor 20 to output the voltage $V_D$ in response to the high voltage source $V_{IN}$. A drain terminal of the first transistor 25 is connected to the second terminal of the JFET transistor 20, and a source terminal of the first transistor 25 is coupled to an output terminal of the switch circuit. The output terminal of the switch circuit is coupled to the load 10. In order to turn on the JFET transistor 20 and the first transistor 25, the resistive device 30 is connected from the third terminal of the JFET transistor 20 to the second terminal of the JFET transistor 20. Additionally, the resistive device 30 is connected between the drain terminal and a gate terminal of the first transistor 25. The resistive device 30 therefore provides a bias voltage to the JFET transistor 20 and the first transistor 25. The resistive device 30 can be implemented by a resistor or a transistor.

A control signal $S_N$ is connected to an input terminal of the switch circuit to turn on the second transistor 50 for turning off the high voltage source $V_{IN}$. A gate terminal of the second transistor 50 is coupled to receive the control signal $S_N$ through an inverter 40. An input terminal of the inverter 40 is coupled to receive the control signal $S_N$. An output terminal of the inverter 40 is coupled to the gate terminal of the second transistor 50. A source terminal of the second transistor 50 is coupled to the ground. A drain terminal of the second transistor 50 is connected to the gate terminal of the first transistor 25 and the third terminal of the JFET transistor 20. Therefore the resistive device 30 provides the bias voltage to turn on the first transistor 25 and the JFET transistor 20 when the second transistor 50 is turned off in response to the enabling state of the control signal $S_N$.

Figure 3:
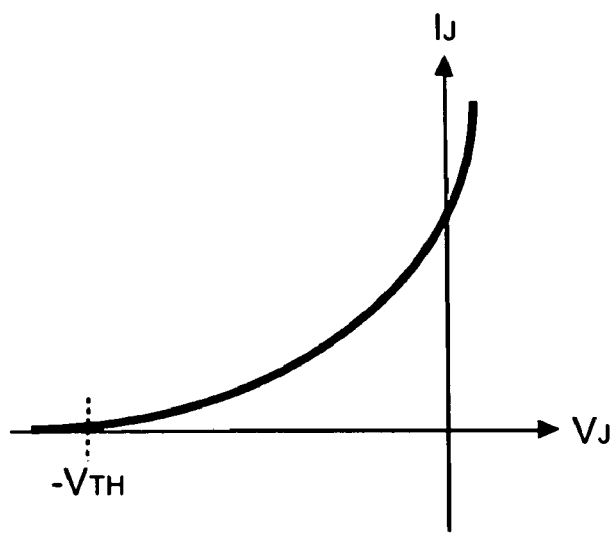
FIG. 3 shows a preferred voltage-to-current curve of a JFET transistor according to the present invention.

Once the second transistor 50 is turned on in response to the disabling state of the control signal $S_N$, the first transistor 25 is turned off to disable the high voltage source $V_{IN}$ to the load 10. Meanwhile, the resistive device 30 will provide a negative bias to the JFET transistor 20 that the second transistor 50 provides the negative bias to the JFET transistor 20 through the resistive device 30. The JFET transistor 20 has a negative threshold voltage $-V_{TH}$. FIG. 3 shows a preferred voltage-to-current curve of the JFET transistor 20. The current $I_J$ is the current flowed through the first terminal and the second terminal of the JFET transistor 20. The voltage $V_J$ is the voltage across the third terminal and the second terminal of the JFET transistor 20. The JFET transistor 20 is developed to operate as a voltage controlled resistance device. The current $I_J$ is decreased in response to the decrease of the voltage $V_J$. When the voltage $V_J$ is lower than the threshold voltage $-V_{TH}$, the JFET transistor 20 will be turned off.

Figure 4:
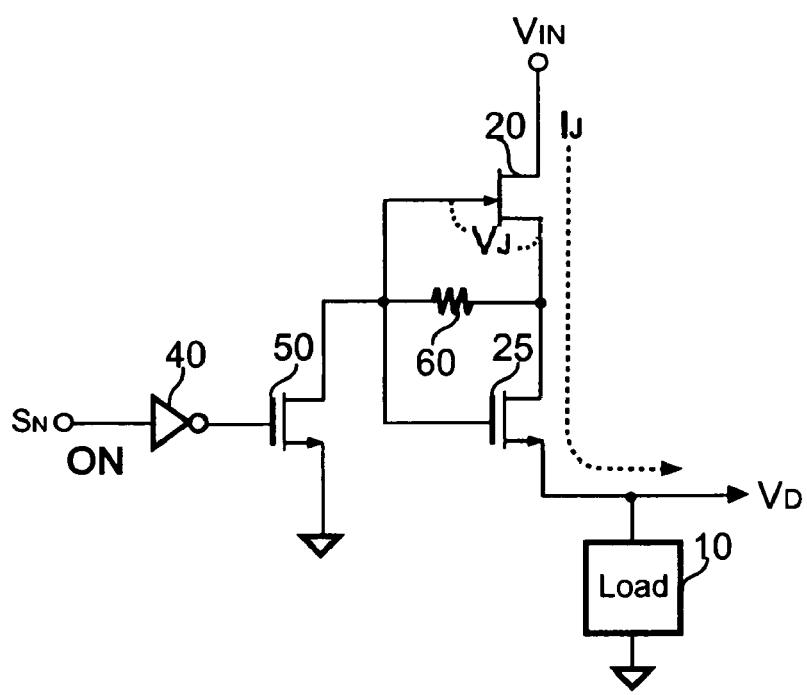
FIG. 4 shows the current flow as the switch circuit is turned on according to the present invention.
Figure 5:
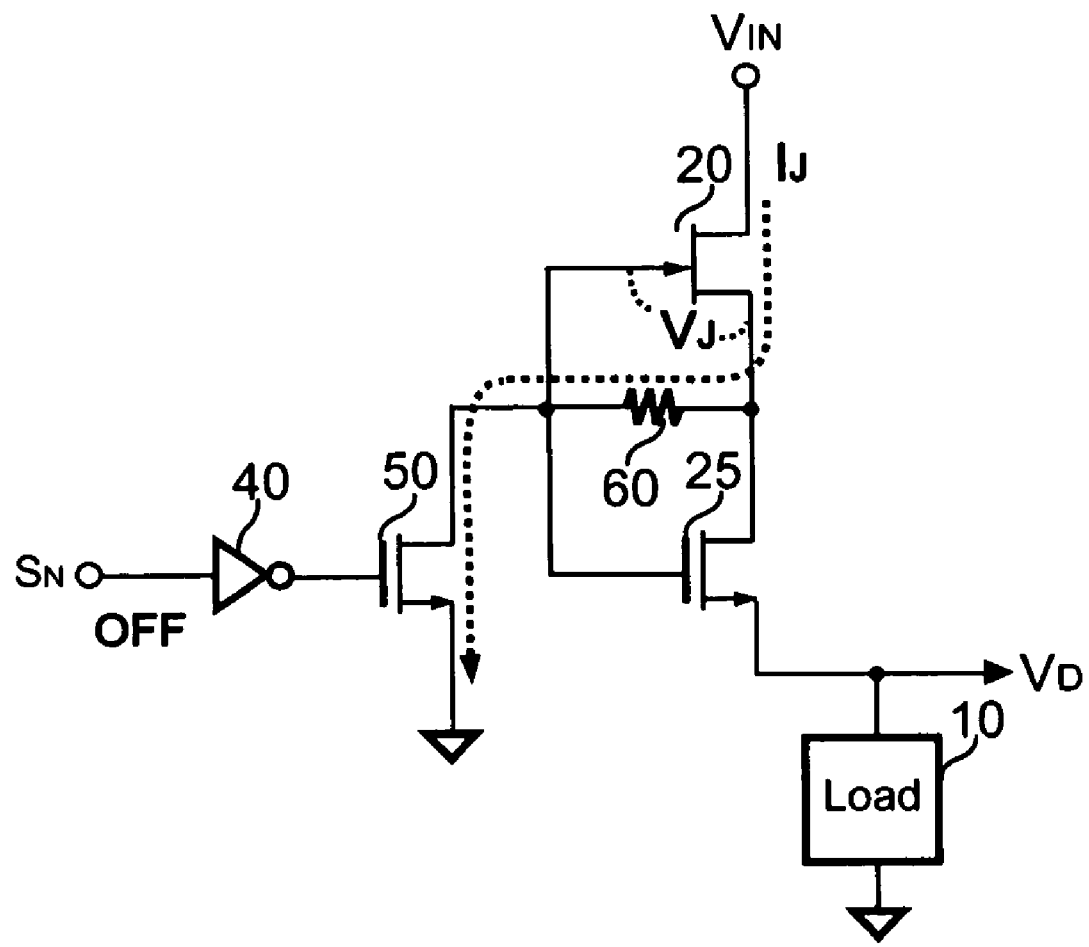
FIG. 5 shows the current flow as the switch circuit is turned off according to the present invention.

FIG. 4 and FIG. 5 respectively show the current $I_J$ flow of on stage and off stage of the switch circuit, in which a resistor 60 is operated as the resistive device 30. In FIG. 4, the second transistor 50 is turned off in response to the enabling of the control signal $S_N$. No current can be flowed through the resistor 60. The resistor 60 thus provides a zero bias to the voltage $V_J$ of the JFET transistor 20. The resistor 60 further provides a same bias between the gate terminal and the drain terminal of the first transistor 25. Therefore, both the JFET transistor 20 and the first transistor 25 are turned on. In FIG. 5, the second transistor 50 is turned on to switch off the first transistor 25 in response to the disabling of the control signal $S_N$. Meanwhile, the current $I_J$ flows through the second transistor 50 and the resistor 60 will provide the negative bias to the voltage $V_J$ of the JFET transistor 20. At this moment, the increase of the current $I_J$ provides further negative bias to the voltage $V_J$ for turning off the JFET transistor 20 and prevents the increase of the current $I_J$. The circuit is operated as a negative feedback. Although there is still has a current flowed through the JFET transistor 20 when the first transistor 25 is turned off, the current is small and negligible. The JFET transistor 20 and the resistive device 30 are appropriate to be built into an integrated circuit. Therefore, the switch circuit shown in FIG. 2 can achieve the objective of this invention.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A switch circuit, comprising:
   a JFET transistor having a first terminal, a second and a third terminal, in which the first terminal is coupled to receive a high voltage source;
   a first transistor having a drain terminal, a source terminal and a gate terminal, in which the drain terminal and the source terminal of the first transistor are connected to the second terminal of the JFET transistor and an output terminal of the switch circuit respectively;
   a second transistor having a drain terminal, a source terminal and a gate terminal, in which the drain terminal of the second transistor is coupled to the gate terminal of the first transistor and the third terminal of the JFET transistor, the gate terminal of the second transistor is coupled to receive a control signal, and the source terminal of the second transistor is coupled to a ground; and
   a resistive device coupled from the third terminal of the JFET transistor to the second terminal of the JFET transistor;
   wherein the resistive device provides a bias voltage to turn on the first transistor and the JFET transistor when the second transistor is turned off, the control signal is coupled to turn on the second transistor for switching off the first transistor.

2. The switch circuit as claimed in claim 1, in which the resistive device provides a negative bias to the JFET transistor once the second transistor is turned on.

3. The switch circuit as claimed in claim 1, in which the JFET transistor has a negative threshold voltage.

4. The switch circuit as claimed in claim 1, in which the JFET transistor is a voltage controlled resistance device.

5. The switch circuit as claimed in claim 1, in which the JFET transistor still has a current flowed through the JFET transistor when the first transistor is turned off.

6. The switch circuit as claimed in claim 1, in which the resistive device can be implemented by a resistor or a transistor.

7. A switch circuit comprising:
   a JFET transistor coupled to receive a high voltage source;
   a first transistor connected serially with the JFET transistor to output a voltage in response to the high voltage source;
   a resistive device coupled to the JFET transistor and the first transistor to provide a bias voltage to turn on the JFET transistor and the first transistor; and
   a second transistor coupled to the first transistor to turn off the first transistor;
   wherein a control signal is coupled to the second transistor to control the second transistor.

8. The switch circuit as claimed in claim 7, in which the second transistor provides a negative bias to the JFET transistor through the resistive device.

9. The switch circuit as claimed in claim 7, in which the JFET transistor has a negative threshold voltage.

10. The switch circuit as claimed in claim 7, in which the JFET transistor is a voltage controlled resistance device.

11. The switch circuit as claimed in claim 7, in which the JFET transistor still has a current flowed through the JFET transistor when the first transistor is turned off.

12. The switch circuit as claimed in claim 7, in which the resistive device can be implemented by a resistor or a transistor.

13. A switch circuit comprising:
   a JFET transistor having a first terminal, a second terminal and a third terminal, in which the first terminal is coupled to receive a high voltage source;
   a resistive device coupled from the third terminal of the JFET transistor to the second terminal of the JFET transistor to turn on/off the JFET transistor in response to a control signal; and
   a second transistor having a drain terminal, a source terminal and a gate terminal, in which the drain terminal of the second transistor is coupled to the third terminal of the JFET transistor, the gate terminal of the second transistor is coupled to receive the control signal, and the source terminal of the second transistor is coupled to a ground, wherein the control signal is coupled to turn on the second transistor, the resistive device provides a negative bias to the JFET transistor once the second transistor is turned on;
   wherein the JFET transistor is turned on for providing a voltage to a load in response to the high voltage source.

14. The switch circuit as claimed in claim 13, in which the resistive device provides a negative bias to the JFET transistor to turn off the JFET transistor.

15. The switch circuit as claimed in claim 13, in which the JFET transistor has a negative threshold voltage.

16. The switch circuit as claimed in claim 13, in which the JFET transistor is a voltage controlled resistance device.

17. The switch circuit as claimed in claim 13, in which the resistive device can be implemented by a resistor or a transistor.

18. The switch circuit as claimed in claim 13, further comprising a first transistor having a drain terminal, a source terminal and a gate terminal, in which the drain terminal and the source terminal of the first transistor are connected to the second terminal of the JFET transistor and an output terminal of the switch circuit respectively, the source terminal of the first transistor providing the voltage to the load coupled to the output terminal, wherein the resistive device is further coupled from the gate terminal of the first transistor to the drain terminal of the first transistor to provide a bias voltage to turn on the first transistor.

* * * * *